(12) United States Patent
Chen et al.

(10) Patent No.: US 12,237,834 B1
(45) Date of Patent: Feb. 25, 2025

(54) ELECTRONIC DEVICE AND METHOD FOR OVERCURRENT DETECTION

(71) Applicant: Elite Semiconductor Microelectronics Technology Inc., Hsinchu (TW)

(72) Inventors: Isaac Y. Chen, Hsinchu (TW); Chih-Sheng Chang, Hsinchu (TW)

(73) Assignee: Elite Semiconductor Microelectronics Technology Inc., Hsinchu (TW)

( * ) Notice: Subject to any disclaimer, the term of this patent is extended or adjusted under 35 U.S.C. 154(b) by 41 days.

(21) Appl. No.: 18/377,372

(22) Filed: Oct. 6, 2023

(51) Int. Cl.
| | | |
|---|---|---|
| *H03K 17/08* | (2006.01) | |
| *G01R 19/165* | (2006.01) | |
| *G05F 3/26* | (2006.01) | |
| *H03K 3/023* | (2006.01) | |
| *H03K 5/22* | (2006.01) | |
| *H03K 17/567* | (2006.01) | |
| *H03K 19/0175* | (2006.01) | |
| *H03K 19/20* | (2006.01) | |

(52) U.S. Cl.
CPC ....... *H03K 3/023* (2013.01); *G01R 19/16566* (2013.01); *G05F 3/267* (2013.01); *H03K 5/22* (2013.01); *H03K 17/567* (2013.01); *H03K 19/017509* (2013.01); *H03K 19/20* (2013.01)

(58) Field of Classification Search
CPC ............ H03K 3/02; H03K 3/023; H03K 5/22; H03K 5/24; H03K 5/2409; H03K 5/2472; H03K 17/08; H03K 17/081; H03K 17/08104; H03K 17/082; H03K 17/0822; H03K 17/567; H03K 19/017509; G01R 19/165; G01R 19/16566; G05F 3/267
See application file for complete search history.

(56) References Cited

U.S. PATENT DOCUMENTS

| | | | | |
|---|---|---|---|---|
| 10,879,803 | B2 * | 12/2020 | Särkkä | .................. H02M 1/143 |
| 2014/0316735 | A1 * | 10/2014 | Jao | .......................... H02H 3/006 |
| | | | | 702/107 |

* cited by examiner

*Primary Examiner* — Long Nguyen
(74) *Attorney, Agent, or Firm* — Cooper Legal Group LLC

(57) ABSTRACT

An electronic device and a method for overcurrent detection are disclosed herein. The electronic device causes a high-side offsetting voltage drop and converts a voltage difference between a first voltage at an input terminal of an upper-bridge power component of a power stage and a sum of a first balancing voltage drop and the high-side offsetting voltage drop into a first current. The electronic device further converts a voltage difference between a second voltage of an output terminal of the upper-bridge power component and a second balancing voltage drop into a second current, compares the first current and the second current, and generates a high-side overcurrent protection (OCP) signal with logic high for a driver of the power stage when the first current is stronger than the second current, such that the driver turns off the upper-bridge power component accordingly.

18 Claims, 5 Drawing Sheets

ELECTRONIC DEVICE AND METHOD FOR OVERCURRENT DETECTION

BACKGROUND OF THE INVENTION

The present disclosure relates to an electronic device and a method for overcurrent detection. More specifically, the present disclosure relates to an electronic device and a method for performing overcurrent detection for a middle-voltage or high-voltage power stage using low-voltage hardware.

Different charging systems can operate at different voltage levels depending on the specific application and the requirements of the devices being charged. The charging systems may be divided into three common voltage levels, i.e., Low Voltage (LV) charging, Medium Voltage (MV) charging, and High Voltage (HV) charging. Low voltage charging typically refers to charging systems that operate at relatively low voltage levels, often below 48 volts. Medium voltage charging systems operate at higher voltage levels, typically ranging from 48 volts to several hundred volts. High voltage charging systems can operate at voltage levels exceeding 800 volts, such as the high-power charging stations capable of providing several hundred kilowatts of power to charge electric vehicles quickly.

In general, there are three primary components in a charging system, i.e., the controller, the power stage, and the driver of the power stage. The power stage handles the main power conversion or amplification tasks, while the driver is responsible for providing the required electrical signals to control and drive the power stage efficiently. As to the controller, it regulates and controls the operation of the power system, e.g., via controlling the driver.

In the past, the three primary components, i.e., the controller, power stage, and driver (of the power stage) are designed and implemented separately in most cases. Therefore, there was no need to consider the compatibility of these components when they are designed or implemented together for a multi-chip module (MCM.) For example, there is a problem regarding how a low-voltage controller (e.g., allowing voltage levels up to around 5-10 volts) performs overcurrent detection and protection (i.e., OCP) for a middle-voltage power state or a high-voltage power stage (e.g., allowing voltage levels up to around 100 volts, such as a power stage based on Gallium Nitride (GaN) materials), since a regular low-voltage controller is not capable of processing (enduring) the currents flowing in a middle-voltage or even high-voltage power stage and thus would fail to monitor and detect abnormality of the currents.

In view of this, there is an urgent need in the art to find a good way of providing OCP for a middle-voltage (or even high-voltage) power stage using low-voltage hardware.

SUMMARY OF THE INVENTION

To solve at least the abovementioned problem, the present disclosure provides an electronic device for overcurrent detection. The electronic device may at least comprise a high-side voltage-to-current (V2I) converter, a high-side voltage offsetting component coupled with the high-side V2I converter and the first high-side comparator, a first high-side comparator coupled with the high-side V2I converter, and a high-side OCP signal generator coupled with the first high-side comparator. The high-side voltage offsetting component may be configured to cause a high-side offsetting voltage drop. The high-side V2I converter may be configured to convert a voltage difference between a sum of the high-side offsetting voltage drop and a first balancing voltage drop caused by the high-side OCP signal generator and a first voltage at an input terminal of an upper-bridge power component of a power stage into a first current. The high-side V2I converter may also be configured to convert a voltage difference between a second voltage of an output terminal of the upper-bridge power component and a second balancing voltage drop caused by the first high-side comparator into a second current. As to the first high-side comparator, it may be configured to compare the first current and the second current, and the high-side OCP signal generator may be configured to generate, when the first current is stronger than the second current, a high-side OCP signal with logic high for a driver of the power stage to turn off the upper-bridge power component accordingly.

To solve at least the abovementioned problem, the present disclosure also provides a method for overcurrent detection. The method may comprise steps as follows:

causing, by a high-side voltage offsetting component, a high-side offsetting voltage drop;

converting, by a high-side voltage-to-current (V2I) converter, a voltage difference between a sum of a first balancing voltage drop caused by the high-side OCP signal generator and the high-side offsetting voltage drop and a first voltage at an input terminal of an upper-bridge power component of a power stage into a first current;

converting, by the high-side V2I converter, a voltage difference between a second voltage of an output terminal of the upper-bridge power component and a second balancing voltage drop caused by a first high-side comparator coupled with the high-side V2I converter into a second current;

comparing, by the first high-side comparator, the first current and the second current; and generating, by a high-side OCP signal generator, a high-side OCP signal with logic high for a driver of the power stage when the first current is stronger than the second current, such that the driver turns off the upper-bridge power component accordingly.

The present disclosure allows a low-voltage OCP circuit to handle the high-side OCP of a middle-voltage power stage or even high-voltage power stage, mainly because it shifts the voltage across the two terminals of the upper-bridge power component from a high-voltage/middle-voltage domain into a low-voltage domain via the first V2I converter as mentioned above. Such an arrangement allows the components of the electronic device of the present disclosure such as comparators to work in a low-voltage domain, and thus may be manufactured in a the low-voltage domain. Not only is it cost-effective, but also relatively easy to implement. As a result, the present disclosure provides that a multi-chip module (MCM) that includes a low-voltage OCP circuit and a middle-voltage power stage can be designed and implemented, and also ensures that the high-side OCP of the power stage can be achieved. That is, the OCP circuit and the power stage can be integrated into one package and still work correctly.

This summary overall describes the core concept of the present invention and covers the problem to be solved, the means to solve the problem and the effect of the present invention to provide a basic understanding of the present invention by those of ordinary skill in the art. However, it shall be appreciated that, this summary is not intended to encompass all embodiments of the present invention but is provided only to present the core concept of the present invention in a simple form and as an introduction to the following detailed description. The detailed technology and preferred embodiments implemented for the subject invention are described in the following paragraphs accompanying the appended drawings for people having ordinary skills in the art to well appreciate the features of the claimed invention.

BRIEF DESCRIPTION OF DRAWINGS

The drawings are provided for describing the embodiments of the present disclosure, wherein.

The contents shown in FIGS. 1-5 are provided only for helpfully illustrating the embodiments of the present disclosure, instead of limiting the scope of the present disclosure.

DETAILED DESCRIPTION OF THE INVENTION

Figure 1:
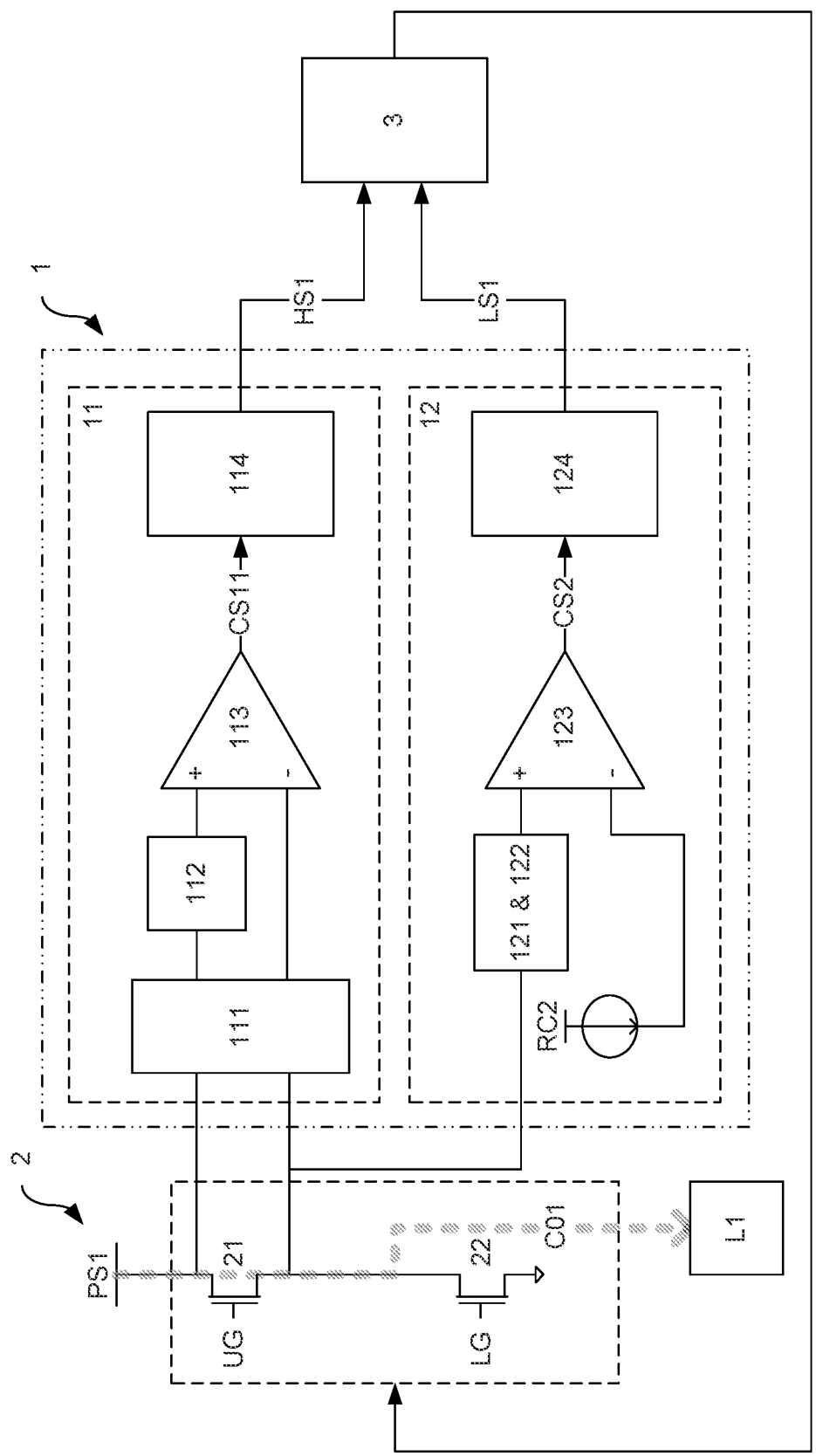
FIG. 1 depicts a schematic view of an electronic device for overcurrent detection according to one or more embodiments of the present disclosure.
Figure 4:
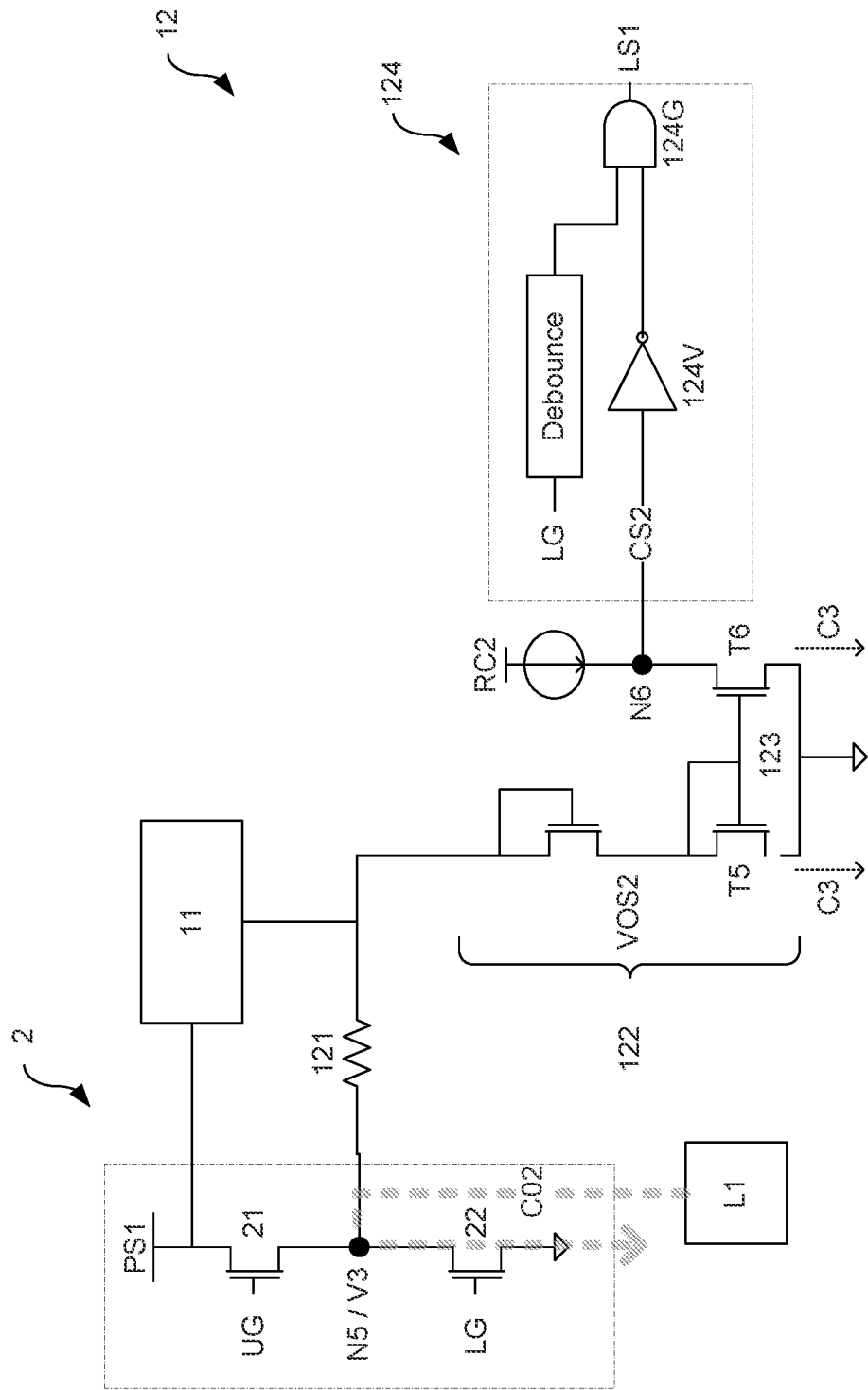
FIG. 4 depicts a schematic view of a low-side overcurrent detection circuit of the electronic device in FIG. 1.

FIG. 1 depicts a schematic view of an electronic device for overcurrent detection according to one or more embodiments of the present disclosure. Referring to FIG. 1, an electronic device 1 for overcurrent detection ("electronic device 1" for short) of the present disclosure may be coupled with a power stage 2 and a driver 3 of the power stage 2. The electronic device 1 may generally be configured to monitor a current C01 flowing through an upper-bridge power component 21 of the power stage 2 to a load L1 and/or a current C02 flowing from the load L1 (as shown in FIG. 4) to a lower-bridge power component 22 of the power stage 2, and respectively perform high-side and low-side overcurrent detections therefor. Correspondingly, the electronic device 1 may comprise a high-side overcurrent detection circuit 11 and a low-side overcurrent detection circuit 12. When a high-side overcurrent event occurs, the high-side overcurrent detection circuit 11, in general, may detect the high-side overcurrent event and provide a high-side OCP signal HS1 for the driver 3 to take necessary actions. Similarly, when a low-side overcurrent event occurs, the low-side overcurrent detection circuit 12, in general, may detect the low-side overcurrent event and provide a low-side OCP signal LS1 for the driver 3 to take necessary actions.

The power stage 2 may be implemented based on wide bandgap semiconductors such as GaN, Silicon Carbide (SiC), Vertical Double-Diffused Metal-Oxide-Semiconductor (VDMOS), Lateral Double-Diffused Metal-Oxide-Semiconductor (LDMOS), or the like. The wide bandgap characteristic allows the power stage 2 to operate at middle or high voltage domains (e.g., from a few hundred volts to even over 1,000 volts.)

The upper-bridge power component 21 may be coupled with a DC power supply PS1 and the load L1 and may be turned on/off by applying an upper-bridge control signal UG to the upper-bridge control signal terminal of the upper-bridge power component 21. The lower-bridge power component 22 may be coupled with the load L1 and a ground level and may be turned on/off by applying a lower-bridge control signal LG to the lower-bridge control signal terminal of the lower-bridge power component 22. When the upper-bridge power component 21 is turned on, current flows from the positive terminal of the power supply PS1, through the load L1, and then back to the negative terminal of the power supply PS1. When the upper-bridge power component 21 is turned off, the lower-bridge power component 22 is turned on and allows current to flow in the opposite direction as shown in FIG. 4.

The load L1 may be one or more electronic devices that accept the power supplied from the power stage 2 and may be, for example, any components used in an audio system.

The driver 3 may generally be configured to provide the required electrical signals to control and/or drive the power stage 2 efficiently. A fast-charging device such as a GaN-based charger typically has high gate capacitance and requires precise voltage and current waveforms to switch on and off rapidly. The driver 3 ensures that the gate voltage and current are properly controlled, allowing the charging device to operate optimally.

The high-side overcurrent detection of electronic device 1 mainly focuses on the upper-bridge power component 21, whereas the low-side current protection mainly focuses on the lower-bridge power component 22. Once a high-side overcurrent event occurs, the electronic device 1 may detect the event and thus provide the high-side OCP signal HS1 with logic high for the driver 3 to turn off the upper-bridge power component 21. Similarly, when a low-side overcurrent event occurs, the electronic device 1 may the event and thus provide the low-side OCP signal LS1 with logic high for the driver 3 to turn off the lower-bridge power component 22.

Figure 2:
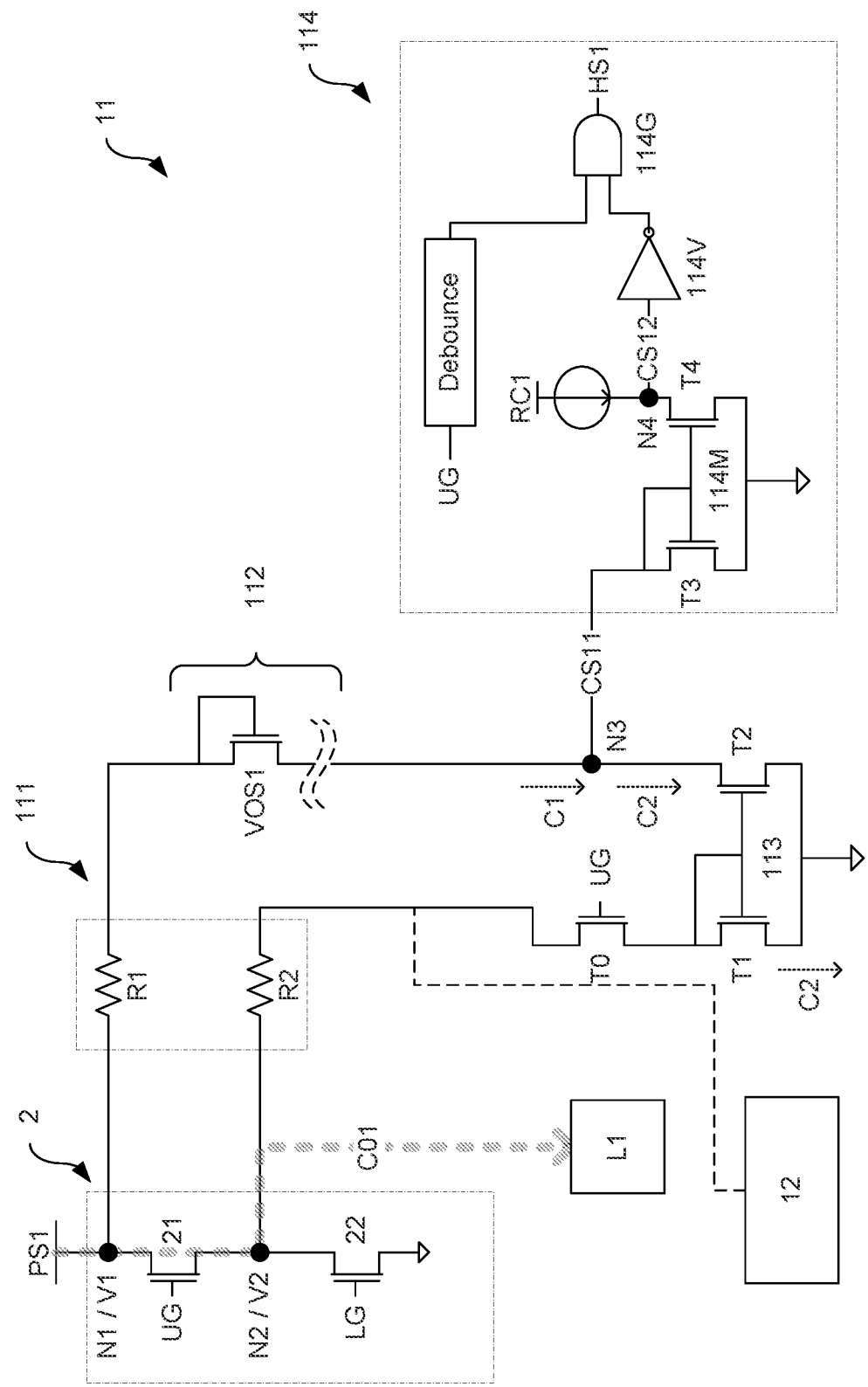
FIG. 2 depicts a schematic view of a high-side overcurrent detection circuit of the electronic device in FIG. 1.

FIG. 2 depicts a schematic view of a feasible structure of the high-side overcurrent detection circuit 11 of the electronic device 1 in FIG. 1. Referring to both FIG. 1 and FIG. 2, the high-side overcurrent detection circuit 11 may basically comprise a high-side V2I converter 111, voltage offsetting component 112, a first high-side comparator 113, and a high-side OCP signal generator 114. The voltage offsetting component 112 may be coupled with the high-side V2I converter 111. The first high-side comparator 113 may be coupled with the voltage offsetting component 112, the high-side V2I converter 111, and the high-side OCP signal generator 114.

To monitor the current flowing through the upper-bridge power component 21 after the upper-bridge power component 21 is turned on, the high-side V2I converter 111 may be coupled with an input terminal (i.e., the node N1 shown in FIG. 2) and an output terminal (i.e., the node N2 shown in FIG. 2) of the upper-bridge power component 21. The input terminal of the upper-bridge power component 21 may refer to the terminal where the current from the power supply PS1 enters the upper-bridge power component 21, and the output terminal may refer to the terminal where the current from the power supply PS1 exits the upper-bridge power component 21.

The voltage offsetting component 112 may be configured to cause a high-side offsetting voltage drop VOS1, and the high-side V2I converter 111 may be configured to convert a voltage difference between a first voltage V1 watched at the node N1 and a sum of the high-side offsetting voltage drop VOS1 and a first balancing voltage drop caused by the high-side OCP signal generator 114 into a first current C1. On the other hand, the high-side V2I converter 111 may also be configured to convert a voltage difference between a second voltage V2 watched at the node N2 and a second balancing voltage drop caused by the first high-side comparator 113 into a second current C2.

The high-side V2I converter 111 may comprise a first resistor R1 coupled with the node N1 and a second resistor R2 coupled with the node N2 as shown in FIG. 2. Each of the first resistor R1 and the second resistor R2 may be a single resistor, or a combination of multiple resistors coupled in series, depending on different situations.

The voltage offsetting component 112 may comprise one or more transistors coupled in series, depending on different situations. In some embodiments, each transistor of the voltage offsetting component 112 may be a diode-connected metal oxide semiconductor field effect transistor (MOSFET), i.e., a MOSFET whose gate electrode is connected to the drain electrode or a diode-connected bipolar junction transistor (BJT), i.e., a BJT whose base is connected to the collector.) A transistor with a diode-connected structure may conduct current in both directions, just like a diode. Moreover, a transistor with a diode-connected structure will cause a voltage drop when there is a current flowing therethrough, i.e., the gate-source voltage of the diode connected transistor, just like a diode.

The first high-side comparator 113 may be implemented as a current mirror that includes two transistors T1 and T2 as the master and slave transistors, respectively. The transistor T1 may be coupled with the second resistor R2. The transistor T1 may also be a diode-connected MOSFET or a diode-connected BJT, and thus will inevitably introduce a voltage drop (i.e., the gate-source voltage of the diode connected transistor T1) to the formation of the second current C2, which is previously referred to as the "second balancing voltage drop." In response, the same amount of voltage drop may be introduced to the formation of the first current C1 in addition to the high-side offsetting voltage drop VOS1, such that the "competition" between the first current C1 and the second current C2 remains fair, and this is where the high-side OCP signal generator 114 comes into play.

The high-side OCP signal generator 114 may comprise an AND gate 114G, a first inverter 114V and a second high-side comparator 114M coupled with the first high-side comparator 113 and the first inverter 114V, in which the second high-side comparator 114M may be implemented as another current mirror that comprises two transistors T3 and T4 as the master and slave transistors, respectively. The transistor T3 may be identical to the transistor T1, which means it may also be diode-connected and may cause the same amount of voltage drop. Therefore, a voltage drop may be caused by the transistor T3 to the formation of the first current C1, thereby balancing the voltage drop caused by the diode-connected transistor T1. The voltage drop caused by the transistor T3 is previously referred to as the "first balancing voltage drop" and is of the same amount as the voltage drop caused by the transistor T1.

The formations of the currents C1 and C2 are described with further details as follows. Still referring to FIG. 1 and FIG. 2, the first voltage V1 is at nearly the same voltage level with the power supply PS1, e.g., around 100 volts. The high-side voltage offsetting component 112 may be used to form or cause the high-side offsetting voltage drop VOS1 to serve as a voltage drop offset by the first voltage V1. The first resistor R1 with certain resistance (e.g., 500,000 ohms) may be used to convert the voltage difference between the first voltage V1 and the sum of the high-side offsetting voltage drop VOS1 and the first balancing voltage drop into an current form, i.e., the first current C1. On the other hand, the second resistor R2 with certain resistance may be used to convert the second voltage V2 into the second current C2. The second resistor R2 may include same amount of resistance as the first resistor R1, e.g., 500,000 ohms.

Accordingly, the current magnitudes of the first current C1 and the second current C2 may be formulated by the following equation:

$$I_{C1} = \frac{V_{N1} - V_{OS1} - V_t}{R_{R1}} \quad \text{(Equation 1)}$$

$$I_{C2} = \frac{V_{N2} - V_t}{R_{R2}} = \frac{V_{N1} - V_{DS} - V_t}{R_{R2}} \quad \text{(Equation 2)}$$

wherein:

$I_{C1}$ represents the current magnitude (current value) of the first current C1;

$I_{C2}$ represents the current magnitude (current value) of the second current C2;

$V_{N1}$ represents the voltage level watched at the node N1, which is almost the same as the voltage provided by the power supply PS1 in the case shown in FIG. 2;

$V_{N2}$ represents the voltage level watched at the node N2, and equals "$V_{N1}$ minus the voltage drop $V_{DS}$ that is caused by the upper-bridge power component 21";

$V_{OS1}$ represents the voltage across the high-side voltage offsetting component 112;

$V_t$ represents the first balancing voltage drop as well as the second balancing voltage drop for $I_{c1}$ and $I_{c2}$ respectively;

$R_{R1}$ represents the resistance of the first resistor R1; and $R_{R2}$ represents the resistance of the second resistor R2.

Note that the first and second voltages V1 and V2 indicate high voltage due to the high-voltage power supply PS1 (e.g., around 100 volts), so they cannot be measured and compared directly by regular low-voltage controllers that allows, e.g., only around 5-10 volts, let alone triggering a high-side OCP. To overcome this problem, the first resistor R1 (in cooperation with the high-side voltage offsetting component 112) and the second resistor R2 of the high-side V2I converter 111 may be used to serve as a clamping mechanism to ensure that the rest components of the high-side overcurrent detection circuit 11 may work well in the low-voltage domain.

The high-side offsetting voltage drop VOS1 may generally be regarded as a threshold for evaluating the voltage drop caused by the upper-bridge power component 21 (i.e., the "$V_{DS}$" shown in Equation 2.) That is, a high-side overcurrent event (e.g., when the current CO1 is around 100 amp) may be detected when the voltage drop caused by the upper-bridge power component 21 is greater than the voltage drop caused by the high-side voltage offsetting component 112, which means at that time the current flows to the load L1 is abnormally large.

The first high-side comparator 113 may be configured to compare the first current C1 and the second current C2 and generate/output an output CS11 accordingly. Specifically, the transistor T1 may be coupled with the second resistor R2 in series to receive the second current C2, and the transistor T2 may be coupled with the high-side voltage offsetting component 112 in series to receive the first current C1. With the function of the current mirror, the second current C2 may be replicated from the current input terminal of the current mirror to the current output terminal of the current mirror. Thus, the first current C1 and the sensed/replicated second current C2 meet and "compete" at a node N3 between the high-side voltage offsetting component 112 and the transistor T2 and jointly form the output CS11 of the first high-side comparator 113 at the node N3. In other words, the output CS11 of the first high-side comparator 113 equals "the first current C1 minus the second current C2".

In some embodiments, there may be another transistor T0 whose gate is controlled by the upper-bridge control signal UG coupled between the second resistor R2 and the transistor T1. As the lower-bridge power component 22 is turned on (i.e., the upper-bridge power component 21 is turned off), the upper-bridge control signal UG will make the transistor T0 turned off either. Thus, the transistor T0 may prevent current C02 from flowing to the high-side overcurrent detection circuit 11 during the lower-bridge power component 22 being turned on.

As shown in FIG. 2, when the first current C1 is stronger than the second current C2, there will be a current flowing from the node N3 to the high-side OCP signal generator 114 of the electronic device 1, and thus, the output CS11 of the first high-side comparator 113 presents logic high. In contrast, when the first current C1 is weaker than the second current C2, there will be a current flowing from the high-side OCP signal generator 114 to the node N3, and thus, the output CS11 of the first high-side comparator 113 presents logic low.

The output CS11 of the first high-side comparator 113 may, to a certain level, indicate whether a high-side overcurrent event has been detected. More specifically, based on Equations 1 and 2, the comparison of the first C1 and the second current C2 may be further formulated by the following equation:

$$I_{C1} - I_{C2} = \begin{cases} \dfrac{V_{N1} - V_{OS1} - V_t}{R_{R1}} - \dfrac{V_{N1} - V_{DS} - V_t}{R_{R2}} & \text{(Equation 3)} \\ \dfrac{V_{DS} - V_{OS1}}{R_{R1}} = \dfrac{V_{DS} - V_{OS1}}{R_{R2}}, \text{ if } R_{R1} = R_{R2} \end{cases}$$

When $R_{R1}$ equals to $R_{R2}$, it may further be concluded that the difference between $I_{C1}$ and $I_{C2}$ becomes positively correlated with the difference between $V_{DS}$ (i.e., the voltage drop caused by the upper-bridge power component 21) and $V_{OS1}$, (i.e., the voltage drop caused by the high-side voltage offsetting component 112.) Under this circumstance, $I_{C1}$ being greater than $I_{C2}$ means that $V_{DS}$ is greater than $V_{OS1}$, which further means that the voltage drop caused by the upper-bridge power component 21 is greater than the predetermined threshold of voltage drop represented by the high-side offsetting voltage drop VOS1. This indicates that too much current has flowed through the upper-bridge power component 21 and then been supplied to the load L1.

Note that the difference between $I_{C1}$ and $I_{C2}$ is still capable of indicating the relationship between $V_{OS1}$ and $V_{DS}$ to some level even when $R_{R1}$ does not equal to $R_{R2}$, and a person having ordinary skill in the art may realize how to make certain adjustments based on Equation 3 and related descriptions mentioned above.

The second high-side comparator 114M may be configured to compare the output CS11 of the first high-side comparator 113 with a first reference current of a first reference current source RC1 and provide an output CS12 for an input of the first inverter 114V. To do so, the transistor T3 may provide a current input terminal of the current mirror, and the current input terminal is coupled with the node N3 to receive the output CS11 of the first high-side comparator 113. With the function of the current mirror, the output CS11 of the first high-side comparator 113 may be replicated from the current input terminal of the current mirror to the current output terminal of the current mirror provided by the transistor T4. In addition, the transistor T4 may be coupled with first reference current source RC1 in series to receive the first reference current. Thus, the output CS11 of the first high-side comparator 113 and the first reference current meet and "compete" at a node N4 and jointly form the output CS12 of the second high-side comparator 114M for the input of the first inverter 114V. In other words, the output CS12 of the second high-side comparator 114M equals the first reference current minus the output CS11 of the first high-side comparator 113.

As shown in FIG. 2, the output CS12 of the second high-side comparator 114M will present logic high when the first reference current is stronger than the output CS11 of the first high-side comparator 113 and will present logic low when the first reference current is weaker than the output CS11 of the first high-side comparator 113. The output of the first inverter 114V, accordingly, presents logic high when the output CS12 of the second high-side comparator 114M presents logic low, namely when the output CS11 of the first high-side comparator 113 is stronger than the first reference current.

The output signal of the first invertor 114V may be provided to the AND gate 114G as one of the inputs of the AND gate 114G, and the upper-bridge control signal UG may be provided as the other input of the AND gate 114G. The high-side OCP signal HS1 will present logic high when both of the output signal of the first invertor 114V and the upper-bridge control signal UG are logic high and will trigger the driver 3 to turn off the upper-bridge power component 21 for overcurrent protection accordingly.

In some embodiments, the upper-bridge control signal UG may be debounced for a certain period, e.g., 100 ns, to avoid misjudgment of an overcurrent event at the initial phases of the upper bridge. More specifically, for high-side over current detection, the debouncing of the upper-bridge control signal UG needs to cover the setting of the voltage between the drain and source of the transistor. For example, in the system of FIG. 2, the first voltage V1 provided by the power supply PS1 is around 100 volts, and the second voltage V2 would rise from 0 volt towards 100 volts. The debouncing time should be able to cover the slew rate of the second voltage V2 from 0 volt to at least the difference between 100 volts and "I*RDS," which may be over or around 100 ns, depending on the system configuration. The debouncing time may be fine-tuned according to different types of application.

The first reference current provided by the first reference current source RC1 as described above may serve as additional threshold for determining whether a high-side overcurrent event occurs. In this case, the high-side overcurrent event will be detected when not only is the first current C1 stronger than the second current C2, but also is the output CS11 of the first high-side comparator 113, a.k.a. the difference between the first current C1 and the second signal C2, stronger than the first reference current (e.g., 1 uA when the resistance of the first resistor R1 is 500,000 ohms.) This means that the threshold for evaluating/estimating the voltage drop caused by upper-bridge power component 21 is adjusted from "the high-side offsetting voltage drop VOS1 only" to "the voltage drop caused by the first reference current (in cooperation with the first resistor R1) plus the high-side offsetting voltage drop VOS1", which can be formulated by the following equation:

$$V_{DS1} = V_{OS1} + I_{RE1} \times R_{R1} = V_{OS1} + V_{ADJ1} \quad \text{(Equation 4)}$$

wherein:

$V_{DSt1}$ represents the threshold of the voltage drop of the upper-bridge power component 21;

$V_{OS1}$ represents the voltage drop caused by the high-side voltage offsetting component 112;

$I_{RE1}$ represents the current magnitude (current value) of the first reference current;

$R_{R1}$ represents the resistance of the first resistor R1; and $V_{ADJ1}$ represents the voltage drop caused by $I_{RE1}$ and $R_{R1}$.

As can be seen from Equation 4, with the threshold being raised up by the first reference current, the voltage drop caused by the upper-bridge power component 21 (i.e., $V_{DS}$ in Equations 2 and 3) needs to be greater than it used to be when without the threshold adjusting mechanism, unless the first reference current is set to only slightly over 0 amp. In some embodiments, the voltage drop caused by the first reference current and the first resistor R1 (i.e., "$V_{ADJ1}$" in Equation 3) may normally be set to, for example but not limited to, 2 volts, whereas in some other embodiments, the voltage drop caused by the first reference current and the first resistor R1 may be set to a bare minimum (i.e., only slightly over 0 volt) such that there is barely a further adjustment performed to the threshold of voltage drop.

Figure 3:
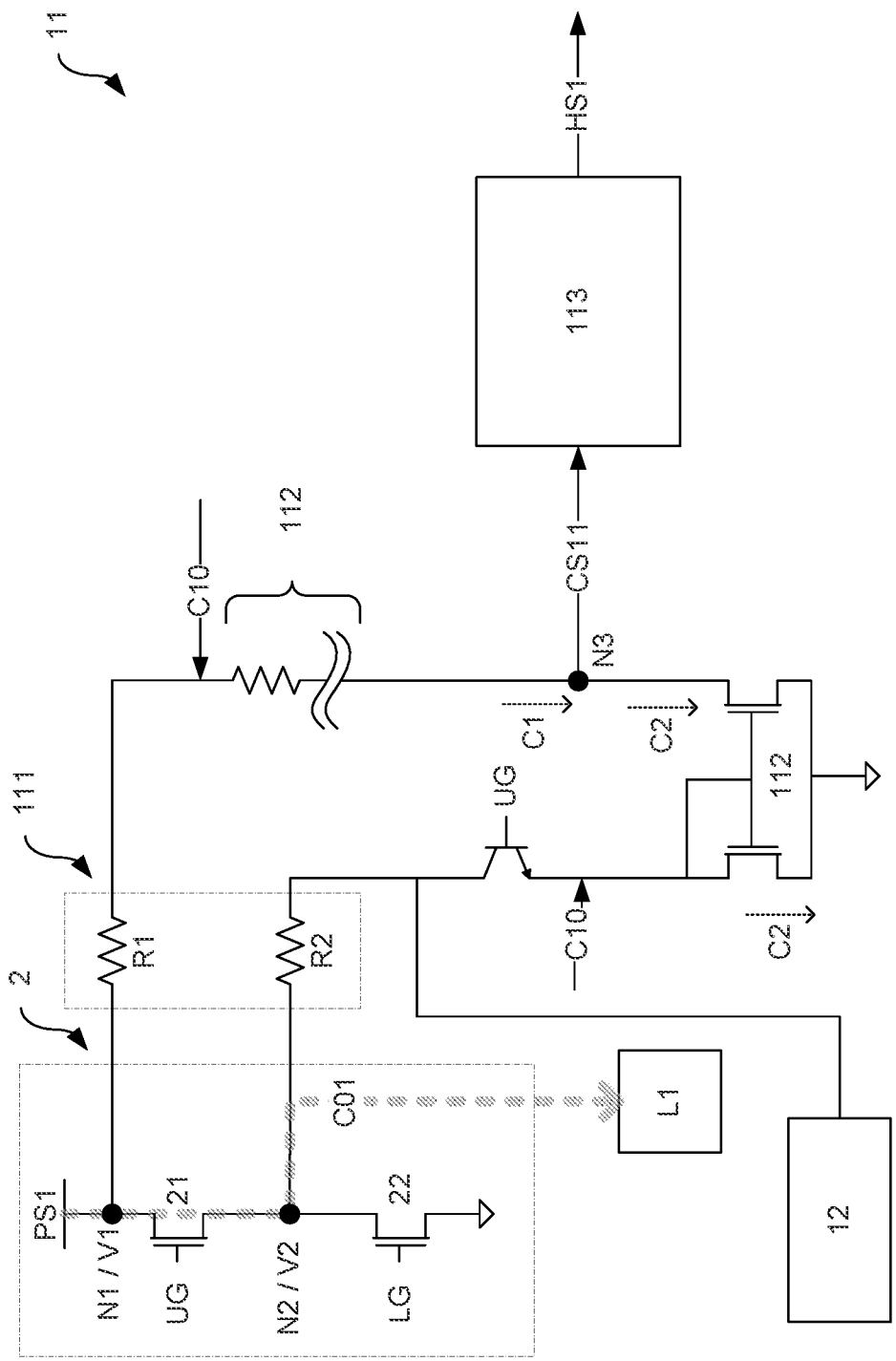
FIG. 3 depicts a schematic view of an alternative of the high-side overcurrent detection circuit of the electronic device in FIG. 2.

As previously described, the voltage offsetting component 112, in some embodiments, may comprise one or more transistors coupled in series, depending on different situations. However, in some other embodiments, the voltage offsetting component 112 may alternatively comprise an offsetting resistor, as shown in FIG. 3. The offsetting resistor may be a single resistor, or a combination of multiple resistors coupled in series, depending on different situations.

FIG. 3 depicts a schematic view of an alternative of the high-side overcurrent detection circuit 11 of the electronic device in FIG. 2. Referring to FIG. 3, the high-side offsetting voltage drop VOS1 may be provided by the offsetting resistor and an additional offsetting current C10 flowing through the offsetting resistor, since the voltage across a circuit is equal to the product of the current flowing through the circuit and the resistance of the circuit. The resistance of the offsetting resistor may be determined based on the estimated voltage drop caused by the upper-bridge power component 21, considering the offsetting current C10.

With the addition of the offsetting current C10, the current magnitude of the first current C1 may thus be adjusted according to the following equation:

$$I_{C1} = \frac{V_{N1} - V_{OS1} - V_t}{R_{R1}} + I_{OS} \quad \text{(Equation 5)}$$

wherein $I_{C1}$ represents the current magnitude (current value) of the first current C1;

$V_{N1}$ represents the voltage level watched at the node N1, which is almost the same as the voltage provided by the power supply PS1 in the case shown in FIG. 2;

$V_{OS1}$ represents the voltage drop caused by the voltage offsetting component 112;

$V_t$ represents the first balancing voltage drop;

$R_{R1}$ represents the resistance of the first resistor R1; and $I_{OS}$ represents the magnitude (current value) of the offsetting current C10.

In response to adding the offsetting current C10 to the first current C1, an equal amount of current is also added to the second current C2 described in Equation 2. This ensures that the comparison between the first current C1 and the second current C2 remains balanced. Thus, the current magnitude of the second current C2 may also be adjusted according to the following equation:

$$I_{C2} = \frac{V_{N1} - V_{DS} - V_t}{R_{R2}} + I_{OS} \quad \text{(Equation 6)}$$

wherein:

$I_{C2}$ represents the current magnitude (current value) of the second current C2;

$V_{N2}$ represents the voltage level watched at the node N2, and equals $V_{N1}$ minus the voltage drop $V_{DS}$ that is caused by the upper-bridge power component 21;

$V_t$ represents the second balancing voltage drop;

$R_{R2}$ represents the resistance of the second resistor R2; and $I_{OS}$ represents the current magnitude (current value) of the offsetting current C10.

FIG. 4 depicts a schematic view of a feasible structure of the low-side overcurrent detection circuit 12 of the electronic device in FIG. 1. Referring to both FIG. 1 and FIG. 4, the low-side overcurrent detection circuit 12 may be coupled with the lower-bridge power component 22 of the power stage 2 to monitor the current C02 flowing therethrough during the lower-bridge power component 22 being turned on (i.e., the upper-bridge power component UG is turned off) such that the lower-bridge power component 22 may be timely turned off after a low-side overcurrent event occurs.

The low-side overcurrent detection circuit 12 may comprise a low-side V2I converter 121 coupled with the lower-bridge power component 22, a low-side voltage offsetting component 122 coupled with the low-side V2I converter 121, a low-side comparator 123 coupled with low-side voltage offsetting component 122, and a low-side OCP signal generator 124 coupled with an output of the low-side comparator 123 (i.e., a node N6 shown in FIG. 4.)

The low-side voltage offsetting component 122 may be configured to cause a low-side offsetting voltage drop VOS2, and the low-side V2I converter 121 may be configured to convert a voltage difference between a third voltage V3 watched at an input terminal (i.e., at a node N5 shown in FIG. 4) of the lower-bridge power component 22 and the low-side offsetting voltage drop VOS2 into a third current C3. The low-side V2I converter 121 may comprise a third resistor R3 coupled with the low-side voltage offsetting component 122. The third resistor R3 may be a single resistor, or a combination of multiple resistors coupled in series, depending on different situations. The low-side offsetting voltage drop VOS2 may be caused/formed based on the low-side voltage offsetting component 122, and the third resistor R3 with certain resistance (e.g., 1,000 ohm) may be used to convert the voltage difference between the low-side offsetting voltage drop VOS2 and the third voltage V3 into the third current C3.

The current magnitude of the third current C3 may be formulated by the following equation:

$$I_{C3} = \frac{V_{N5} - V_{OS2}}{R_{R3}} \quad \text{(Equation 7)}$$

wherein:

$I_{C3}$ represents the current magnitude (current value) of the third current C3;

$V_{N5}$ represents the voltage level watched at the node N5 (i.e., the third voltage V3);

$V_{OS2}$ represents the voltage drop caused by the low-side voltage offsetting component 122; and $R_{R3}$ represents the resistance of the third resistor R3.

In some embodiments, the low-side voltage offsetting component 122 may comprise one or more transistors coupled in series, just like the high-side voltage offsetting component 112 does. In some embodiments, the low-side voltage offsetting component 122 and the low-side comparator 123 may share the transistor T5 in FIG. 4, and the gate-source voltage of the transistor T5 (e.g., around 0.7 volts) may be included in the voltage "$V_{OS2}$" in Equation 7 when the transistor T5 is shared by the low-side voltage offsetting component 122 and the low-side comparator 123. Each transistor of the low-side voltage offsetting component 122 and the transistor T5 may be a diode-connected MOSFET or a diode-connected BJT.

In some embodiments, the low-side V2I converter 121 may adopt the second resistor R2 of the high-side V2I converter 111 to serve as the third resistor R3, since the two circuits function alternately in a time-wise manner. Note that the resistance "$R_{R3}$" in Equation 7 is equal to "$R_{R2}$" in Equations 2, 3, and 6 when the second resistor R2 is shared by the high-side V2I converter 111 and the low-side V2I converter 121.

The low-side comparator 123, in general, may be configured to compare the third current C3 with a second reference current provided by a second reference current source RC2. In some embodiments, like the first and second high-side comparators 112 and 114M, the low-side comparator 123 may also be implemented as a current mirror that includes two transistors T5 and T6 as a master and a slave, respectively. The transistor T5 may be coupled with the low-side voltage offsetting component 122 in series to receive the third current C3. With the function of the current mirror, the third current C3 may be replicated from the current input terminal of the current mirror (provided by the transistor T5) to the current output terminal of the current mirror (provided by the transistor T6.) In addition, the transistor T6 may be coupled with second reference current source RC2 in series to receive the second reference current. Thus, the third current C3 and the second reference current meet and "compete" at the node N6 and jointly form an output CS2 of the low-side comparator 123 at the node N6. In other words, the output CS2 of the low-side comparator 123 equals the second reference current minus the third current C3.

The low-side comparator 123 may provide the output CS2 of the low-side comparator 123 according to the result of "competition" at the node N6. Specifically, the output CS2 of the low-side comparator 123 will present logic high when the second reference current is stronger than the third current C3 at the node N6. The output CS2 of the low-side comparator 123 will present logic low when the third current C3 is stronger than the second reference current at the node N6.

The low-side OCP signal generator 124 may comprise a second inverter 124V and a second AND gate 124G. The second inverter 124V may be coupled with the low-side comparator 123 at the node N6, while the second AND gate 124G may be coupled with an output of the second inverter 124V and the lower-bridge control signal terminal of the lower-bridge power component 22. The second AND gate 124G may output the low-side OCP signal LS1 with logic high for the driver 3 to turn off the lower-bridge power component 22 when a low-side overcurrent event is detected.

As shown in FIG. 4, the low-side OCP signal LS1 will present logic high when the lower-bridge control signal LG present logic high and the output CS2 of the low-side comparator 123 present logic low. In some embodiments, the lower-bridge control signal LG may be debounced for a certain period, e.g., 100 ns, to avoid misjudgment of a low-side overcurrent event at the initial phases of the lower bridge.

The output CS2 of the low-side comparator 123 being logic low means not only that the third voltage V3 is stronger than the low-side offsetting voltage drop VOS2, but also that the third current C3 is stronger than the second reference current of the second reference current source RC2. This brings two thresholds for determining whether a low-side overcurrent event occurs, i.e., the low-side offsetting voltage drop VOS2 and the second reference current.

When a low-side overcurrent (or short circuit) event has been detected, the voltage level watched at the input terminal (i.e., at the node N5 shown in FIG. 4) of the lower-bridge power component 22, which should have been kept low to near the ground level, would be pulled up to an undesired high level, e.g., near the voltage level of the power supply PS1. Therefore, an undesired current output to the load L1 is likely to exist even during the upper-bridge power component 21 being turned off. The low-side offsetting voltage drop VOS2 (e.g., 1.4 volts, which equals twice the gate-source voltage) may serve as a threshold for estimating the voltage level watched at the node N5.

As to the second reference current, in some embodiments, it may be set to a bare minimum (e.g., only slightly over 0 amp) for triggering the function of the low-side comparator 123, such that the determination of a low-side overcurrent event is based on the third current C3 only. However, in some other embodiments, like the first reference current source RC1, the second reference current may serve as an adjusting mechanism of the threshold for determining whether a low-side overcurrent event occurs. In this case, the low-side overcurrent event will be detected when the third current C3 is stronger than second reference current (e.g., 1 uA when the resistance of the second resistor R2 or the third resistor R3 is 500,000 ohms.) This means that the threshold for evaluating/estimating the voltage level at the lower-bridge power component 22 is adjusted from "the low-side offsetting voltage drop VOS2 only" to "the low-side offsetting voltage drop VOS2 plus the voltage drop caused by the second reference current (in cooperation with the third resistor R3)", which can be formulated by the following equation:

$$V_{DSI2}=V_{OS2}+I_{RE2} \times R_{R3}=V_{OS2}+V_{ADJ2} \quad \text{(Equation 8)}$$

wherein:

$V_{DSI2}$ represents the threshold of the voltage level watched at the node N5;

$V_{OS2}$ represents the voltage drop caused by the low-side voltage offsetting component 122;

$I_{RE2}$ represents the current of the second reference current;

$R_{R3}$ represents the resistance of the third resistor R3; and $V_{ADJ2}$ represents the voltage drop caused by $I_{RE2}$ and $R_{R3}$.

Note that in the embodiments where the second resistor R2 is shared by the high-side V2I converter 111 and the low-side V2I converter 121, the resistance "$R_{R3}$" in Equation 8 is also equal to "$R_{R2}$" in Equations 2, 3, and 6.

In some embodiments, the electronic device 1, the power stage 2, and the driver 3 may be implemented in the same package. The package may be implemented based on technologies such as Wafer Level Fan-Out (WLFO) packaging, low thermal resistance heat conduction lead frame, extra substrate, etc.

Based on the above descriptions, the electronic device 1 of the present disclosure provides a good way of performing high-side overcurrent detection and protection as well as low-side overcurrent detection and protection, and both of which can be achieved by the level-shifting and V2I mechanisms in the low-voltage hardware.

As disclosed, the resistors are adopted to endure and cope with the high voltage levels, such that the high-side overcurrent detection circuit 11 and the low-side overcurrent detection circuit 12 of the electronic device 1 of the present disclosure can smoothly shift the high-voltage levels applied to the upper-bridge power component 21 to a low-voltage domain. Thus, the voltage applied to the electronic device 1 may be clamped with a low voltage level such that the components of the electronic device 1 can work well in the low-voltage domain.

As disclosed, the V2I mechanisms are adopted to convert the concerned voltages for determining whether an overcurrent event occurs into currents (i.e., the first current C1, the second current C2, and the third current C3), and thus, the overcurrent detection and protection can be achieved in a current form instead of a voltages form. The proposed method well outperforms the conventional way of using partial voltages signals for overcurrent detection and protection, because it can keep the target voltage difference from being "diluted" to a partial voltage that is too subtle to implement when attempting to shift the high voltage signals (e.g., 100 volts) to low-voltage voltage signals (5 volts) and when the voltage difference of the high voltage signals is subtle (e.g., 2 millivolt from 100 volts and 98 volts.) The conversion and comparison of currents performed in the present disclosure jointly "reflects" the condition (i.e., whether it is) of the voltage drop caused by the upper-bridge power component 21 (as shown in the Equation 5 above), while the offsetting mechanism performed in the present disclosure ensures the comparison between the voltage drop caused by the upper-bridge power component 21 and the threshold, thus achieving the effect of OCP that is based on the comparison of currents.

Figure 5:
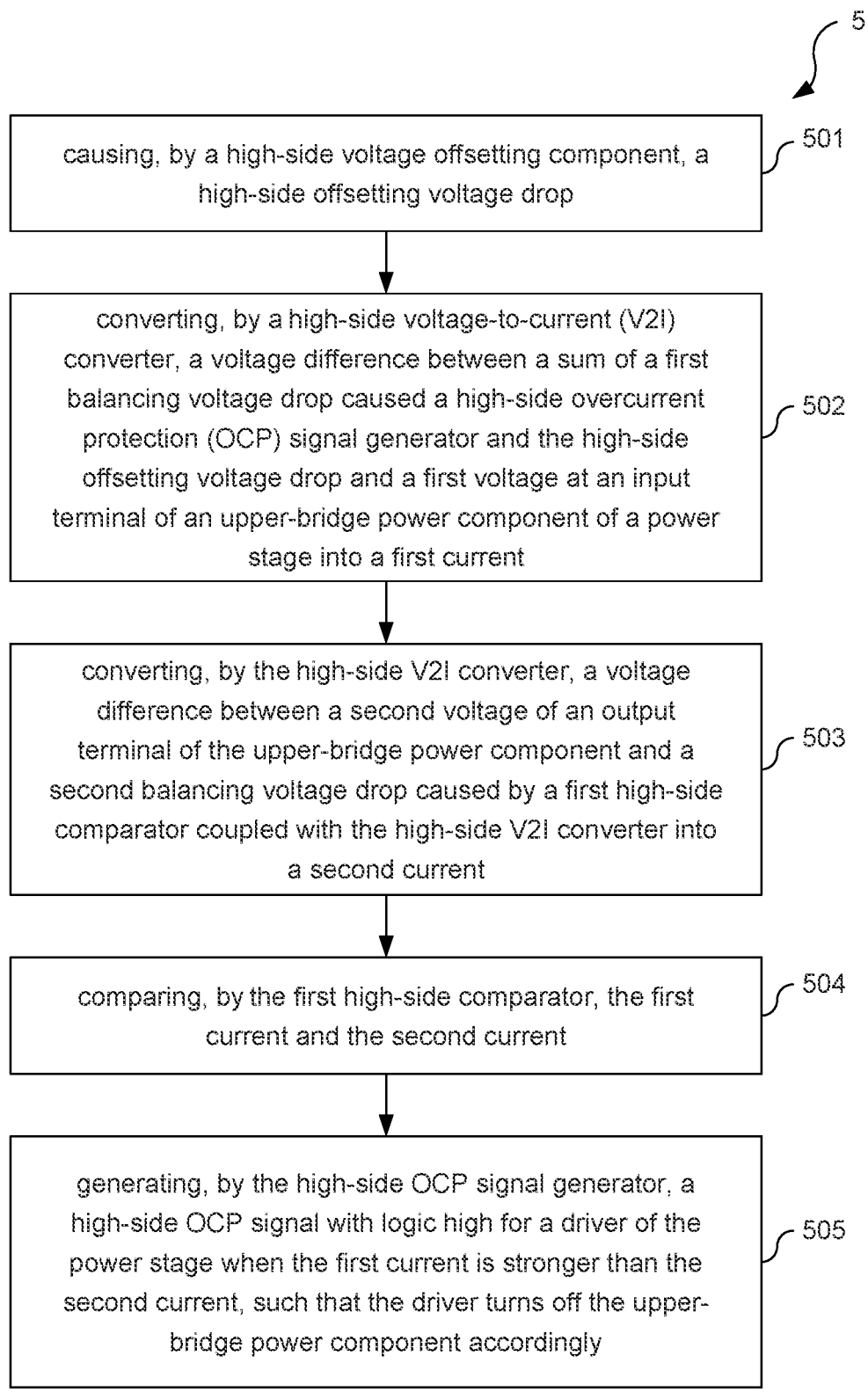
FIG. 5 depicts a method for overcurrent detection according to one or more embodiments of the present disclosure.

FIG. 5 depicts a method for overcurrent detection according to one or more embodiments of the present disclosure. Referring to FIG. 5, a method 5 for overcurrent detection ("method 5" for short) may comprise steps as follows:

causing, by a high-side voltage offsetting component, a high-side offsetting voltage drop (labeled as step 501);
  converting, by a high-side voltage-to-current (V2I) converter, a voltage difference between a sum of a first balancing voltage drop caused by a high-side OCP signal generator and the high-side offsetting voltage drop and a first voltage at an input terminal of an upper-bridge power component of a power stage into a first current (labeled as step 502);
  converting, by the high-side V2I converter, a voltage difference between a second voltage of an output terminal of the upper-bridge power component and a second balancing voltage drop caused by a first high-side comparator coupled with the high-side V2I converter into a second current (labeled as step 503);
  comparing, by the first high-side comparator, the first current and the second current (labeled as step 504); and
  generating, by the high-side OCP signal generator, a high-side OCP signal with logic high for a driver of the power stage when the first current is stronger than the second current, such that the driver turns off the upper-bridge power component accordingly (labeled as step 505).

In some embodiments, regarding the method 5, the voltage difference between the first voltage and the sum of the high-side offsetting voltage drop and the first balancing voltage drop may be converted into the first current via a first resistor of the high-side V2I converter, the first resistor being coupled with the high-side voltage offsetting component. Moreover, the second voltage is converted into the second current via a second resistor of the high-side V2I converter, the second resistor being coupled with the output terminal of the upper-bridge power component and the first high-side comparator. In some embodiments, the first high-side comparator may further be a first current mirror, and the first current mirror may further include a first transistor coupled with the second resistor and a second transistor coupled with the high-side voltage offsetting component, and the second balancing voltage drop may be caused by the first transistor.

In some embodiments, regarding the method 5, the voltage difference between the first voltage and the sum of the high-side offsetting voltage drop and the first balancing voltage drop may be converted into the first current via a first resistor of the high-side V2I converter, the first resistor being coupled with the high-side voltage offsetting component. Moreover, the second voltage is converted into the second current via a second resistor of the high-side V2I converter, the second resistor being coupled with the output terminal of the upper-bridge power component and the first high-side comparator. Moreover, in some embodiments, the high-side voltage offsetting component may further comprise at least one diode-connected metal oxide semiconductor field effect transistor or at least one diode-connected bipolar junction transistor to cause the high-side offsetting voltage drop.

In some embodiments, regarding the method 5, the voltage difference between the first voltage and the sum of the high-side offsetting voltage drop and the first balancing voltage drop may be converted into the first current via a first resistor of the high-side V2I converter, the first resistor being coupled with the high-side voltage offsetting component. Moreover, the second voltage is converted into the second current via a second resistor of the high-side V2I converter, the second resistor being coupled with the output terminal of the upper-bridge power component and the first high-side comparator. In addition, in some embodiments, the high-side voltage offsetting component may further comprise an offsetting resistor flowed through by an offsetting current to cause the high-side offsetting voltage drop, and each of the first current and the second current may include the offsetting current.

In some embodiments, regarding the method 5, the voltage difference between the first voltage and the sum of the high-side offsetting voltage drop and the first balancing voltage drop may be converted into the first current via a first resistor of the high-side V2I converter, the first resistor being coupled with the high-side voltage offsetting component. Moreover, the second voltage is converted into the second current via a second resistor of the high-side V2I converter, the second resistor being coupled with the output terminal of the upper-bridge power component and the first high-side comparator. In some embodiments, the method 5 may further comprise the steps of: "comparing, by a second high-side comparator of a high-side OCP signal generator, an output of the first high-side comparator with a first reference current of a first reference current source," "providing, by the second high-side comparator, an output of the second high-side comparator for an input of a first inverter high-side OCP signal generator, wherein the first inverter is coupled with the second high-side comparator, and the output of the second high-side comparator is logic low when the output of the first high-side comparator is stronger than the first reference current," and "outputting, by a first AND gate of the high-side OCP signal generator, the high-side OCP signal with logic high for the driver to turn off the upper-bridge power component, wherein the first AND gate is coupled with an output of the first inverter and an upper-bridge control signal terminal of the upper-bridge power component." Additionally, in some embodiments, the second high-side comparator may be a second current mirror, and the second current mirror may include a third transistor coupled with a second transistor of a first current mirror and a fourth transistor coupled with the first reference current source, such that the output of the first high-side comparator and the first reference current jointly form the output of the second high-side comparator.

In some embodiment, the method 5 may further comprise the steps of: "causing, by a low-side voltage offsetting component coupled with the low-side comparator, a low-side offsetting voltage drop," "converting, by a low-side V2I converter coupled with the low-side voltage offsetting component and a lower-bridge power component of the power stage, a voltage difference between the low-side offsetting voltage drop and a third voltage at an input terminal of the lower-bridge power component into a third current," and "comparing, by a low-side comparator coupled with the low-side V2I converter, the third current with a second reference current and generating an output that indicates a low-side overcurrent event has been detected when the third current is stronger than the second reference current, such that the lower-bridge power component is turned off by the driver." Moreover, in some further embodiments, the method 5 may further comprise a step of "outputting, by a second AND gate of a low-side OCP signal generator, a low-side OCP signal with logic high for the driver to turn off the lower-bridge power component accordingly." In these further embodiments, the second AND gate may be coupled with an output of a second inverter of the low-side OCP signal generator and a lower-bridge control signal terminal of the lower-bridge power component, and the second inverter may be coupled with the low-side comparator to receive the output of the low-side comparator, wherein the output of the low-side comparator is logic low when the third current is stronger than the second reference current.

Each embodiment of the method 5 basically corresponds to a certain embodiment of the electronic device 1. Therefore, those of ordinary skill in the art may fully understand and implement all the corresponding embodiments of the method 5 simply by referring to the above descriptions of the electronic device 1, even though not all the embodiments of the method 5 are described in detail above.

The above disclosure is related to the detailed technical contents and inventive features thereof. People of ordinary skill in the art may proceed with a variety of modifications and replacements based on the disclosures and suggestions of the invention as described without departing from the characteristics thereof. Nevertheless, although such modifications and replacements are not fully disclosed in the above descriptions, they have substantially been covered in the following claims as appended.

The invention claimed is:

1. An electronic device for overcurrent detection, comprising a high-side voltage-to-current (V2I) converter, a high-side voltage offsetting component, a first high-side comparator, and a high-side overcurrent protection (OCP) signal generator, wherein:
the high-side voltage offsetting component is coupled with the high-side V2I converter and the first high-side comparator and is configured to cause a high-side offsetting voltage drop;
the high-side V2I converter is configured to:
convert a voltage difference between a sum of the high-side offsetting voltage drop and a first balancing voltage drop caused by the high-side OCP signal generator and a first voltage at an input terminal of an upper-bridge power component of a power stage into a first current; and
convert a voltage difference between a second voltage of an output terminal of the upper-bridge power component and a second balancing voltage drop caused by the first high-side comparator into a second current;
the first high-side comparator is coupled with the high-side V2I converter and is configured to compare the first current and the second current; and
the high-side OCP signal generator is coupled with the first high-side comparator and is configured to generate, when the first current is stronger than the second current, a high-side OCP signal with logic high for a driver of the power stage to turn off the upper-bridge power component accordingly.

2. The electronic device of claim 1, wherein the high-side V2I converter comprises:
a first resistor, being coupled with the high-side voltage offsetting component and the input terminal of the upper-bridge power component and configured to convert the voltage difference between the first voltage and the sum of the high-side offsetting voltage drop and the first balancing voltage drop into the first current; and
a second resistor, being coupled with the output terminal of the upper-bridge power component and the first high-side comparator and configured to convert the voltage difference between the second voltage and the second balancing voltage drop into the second current.

3. The electronic device of claim 2, wherein:
the first high-side comparator is a first current mirror, and the first current mirror comprises a first transistor coupled with the second resistor and a second transistor coupled with the high-side voltage offsetting component; and
the second balancing voltage drop is caused by the first transistor.

4. The electronic device of claim 2, wherein the high-side voltage offsetting component comprises at least one diode-connected metal oxide semiconductor field effect transistor or at least one diode-connected bipolar junction transistor to cause the high-side offsetting voltage drop.

5. The electronic device of claim 2, wherein the high-side voltage offsetting component comprises an offsetting resistor flowed through by an offsetting current to cause the high-side offsetting voltage drop, and each of the first current and the second current comprises the offsetting current.

6. The electronic device of claim 1, wherein the high-side OCP signal generator comprises:
a first inverter;
a second high-side comparator, being coupled with the first high-side comparator and the first inverter and configured to compare an output of the first high-side comparator with a first reference current of a first reference current source and provide an output of the second high-side comparator for an input of the first inverter, wherein the output of the second high-side comparator is logic low when the output of the first high-side comparator is stronger than the first reference current; and a first AND gate, being coupled with an output of the first inverter and an upper-bridge control signal terminal of the upper-bridge power component and configured to output the high-side OCP signal with logic high for the driver to turn off the upper-bridge power component.

7. The electronic device of claim 6, wherein the second high-side comparator is a second current mirror, and the second current mirror comprises a third transistor coupled with a second transistor of a first current mirror and a fourth transistor coupled with the first reference current source, such that the output of the first high-side comparator and the first reference current jointly form the output of the second high-side comparator, and wherein the first balancing voltage drop is caused by the third transistor.

8. The electronic device of claim 1, further comprising:
a low-side voltage offsetting component, being configured to cause a low-side offsetting voltage drop;
a low-side V2I converter, being coupled with the low-side voltage offsetting component and a lower-bridge power component of the power stage and configured to convert a voltage difference between the low-side offsetting voltage drop and a third voltage at an input terminal of the lower-bridge power component into a third current;
a low-side comparator, being coupled with the low-side V2I converter and configured to compare the third current with a second reference current; and
a low-side OCP signal generator, being coupled with the low-side comparator and configured to generate, when the third current is stronger than the second reference current, a low-side OCP signal with logic high for the driver to turn off the lower-bridge power component.

9. The electronic device of claim 8, wherein the low-side OCP signal generator comprises:
a second inverter, being coupled with the low-side comparator to receive an output of the low-side comparator, wherein the output of the low-side comparator is logic low when the third current is stronger than the second reference current; and
a second AND gate, being coupled with an output of the second inverter and a lower-bridge control signal terminal of the lower-bridge power component and configured to output the low-side OCP signal with logic high for the driver to turn off the lower-bridge power component when the third current is stronger than the second reference current and a lower-bridge control signal of the lower-bridge control signal terminal is logic high.

10. A method for overcurrent detection, comprising steps as follows:
causing, by a high-side voltage offsetting component, a high-side offsetting voltage drop;
converting, by a high-side voltage-to-current (V2I) converter, a voltage difference between a sum of a first balancing voltage drop caused by a high-side overcurrent protection (OCP) signal generator and the high-side offsetting voltage drop and a first voltage at an input terminal of an upper-bridge power component of a power stage into a first current;
converting, by the high-side V2I converter, a voltage difference between a second voltage of an output terminal of the upper-bridge power component and a second balancing voltage drop caused by a first high-side comparator coupled with the high-side V2I converter into a second current;
comparing, by the first high-side comparator, the first current and the second current; and
generating, by the high-side OCP signal generator, a high-side OCP signal with logic high for a driver of the power stage when the first current is stronger than the second current, such that the driver turns off the upper-bridge power component accordingly.

11. The method of claim 10, wherein:
the voltage difference between the first voltage and the sum of the high-side offsetting voltage drop and the first balancing voltage drop is converted into the first current via a first resistor of the high-side V2I converter, the first resistor being coupled with the high-side voltage offsetting component; and
the voltage difference between the second voltage and the second balancing voltage drop is converted into the second current via a second resistor of the high-side V2I converter, the second resistor being coupled with the output terminal of the upper-bridge power component and the first high-side comparator.

12. The method of claim 11, wherein:
the first high-side comparator is a first current mirror, and the first current mirror comprises a first transistor coupled with the second resistor and a second transistor coupled with the high-side voltage offsetting component; and
the second balancing voltage drop is caused by the first transistor.

13. The method of claim 11, wherein the high-side voltage offsetting component comprises at least one diode-connected metal oxide semiconductor field effect transistor or at least one diode-connected bipolar junction transistor to cause the high-side offsetting voltage drop.

14. The method of claim 11, wherein the high-side voltage offsetting component comprises an offsetting resistor flowed through by an offsetting current to cause the high-side offsetting voltage drop, and each of the first current and the second current comprises the offsetting current.

15. The method of claim 11, further comprising:
comparing, by a second high-side comparator of the high-side OCP signal generator, an output of the first high-side comparator with a first reference current of a first reference current source;
providing, by the second high-side comparator, an output of the second high-side comparator for an input of a first inverter of the high-side OCP signal generator, wherein the first inverter is coupled with the second high-side comparator, and the output of the second high-side comparator is logic low when the output of the first high-side comparator is stronger than the first reference current; and
outputting, by a first AND gate of the high-side OCP signal generator, the high-side OCP signal with logic high for the driver to turn off the upper-bridge power component, wherein the first AND gate is coupled with an output of the first inverter and an upper-bridge control signal terminal of the upper-bridge power component.

16. The method of claim 15, wherein the second high-side comparator is a second current mirror, and the second current mirror comprises a third transistor coupled with a second transistor of a first current mirror and a fourth transistor coupled with the first reference current source, such that the output of the first high-side comparator and the first reference current jointly form the output of the second high-side comparator.

17. The method of claim 10, further comprising:
causing, by a low-side voltage offsetting component coupled with the low-side comparator, a low-side offsetting voltage drop;
converting, by a low-side V2I converter coupled with the low-side voltage offsetting component and a lower-bridge power component of the power stage, a voltage difference between the low-side offsetting voltage drop and a third voltage at an input terminal of the lower-bridge power component into a third current; and
comparing, by a low-side comparator coupled with the low-side V2I converter, the third current with a second reference current and generating an output that indicates a low-side overcurrent event has been detected when the third current is stronger than the second reference current, such that the lower-bridge power component is turned off by the driver.

18. The method of claim 17, further comprising:
outputting, by a second AND gate of a low-side OCP signal generator, a low-side OCP signal with logic high for the driver to turn off the lower-bridge power component accordingly;
wherein the second AND gate is coupled with an output of a second inverter of the low-side OCP signal generator and a lower-bridge control signal terminal of the lower-bridge power component, and the second inverter is coupled with the low-side comparator to receive the output of the low-side comparator, wherein the output of the low-side comparator is logic low when the third current is stronger than the second reference current.

* * * * *